United States Patent [19]

Honebrink et al.

[11] 4,146,930
[45] Mar. 27, 1979

[54] THERMOPLASTIC OPTICAL RECORDING SYSTEM

[75] Inventors: Roger W. Honebrink, Chaska; David S. Lo, Burnsville, both of Minn.

[73] Assignee: Sperry Rand Corporation, New York, N.Y.

[21] Appl. No.: 857,143

[22] Filed: Dec. 5, 1977

[51] Int. Cl.² .................. G11C 11/46; G11C 7/00
[52] U.S. Cl. .................................. 365/126; 365/215; 365/217
[58] Field of Search ............... 365/126, 125, 128, 217, 365/215, 234, 237

[56] References Cited

U.S. PATENT DOCUMENTS

| 3,735,031 | 5/1973 | Waters | 365/126 |
| 4,041,532 | 8/1977 | Plows et al. | 365/126 |
| 4,059,827 | 11/1977 | Byatt | 365/126 |

OTHER PUBLICATIONS

Glenn et al, Lumatron-A Light Valve Storage Display, Conference: Proceedings Two Day Seminar on Novel Audio-Visual Imaging Systems, New York, U.S.A. (Sep. 23-24, 1971).

Primary Examiner—Stuart N. Heckler
Attorney, Agent, or Firm—Kenneth T. Grace; William E. Cleaver; Marshall M. Truex

[57] ABSTRACT

An apparatus for and a method of optically recording or writing data into a thermoplastic layer is disclosed. The recording medium is fabricated as an integral part of the face of a cathode ray tube (CRT) and includes a layer of thermoplastic material that is thermoplastically responsive to a heating light beam having a wavelength within the infrared (IR) range and that is a dielectric capable of storing charges corresponding to a data-containing charging (electron) beam. The thermoplastic layer is first selectively exposed to the charging (electron) beam for spatially selectively electrically charging the exposed surface of the thermoplastic layer and is then softened by the heating (IR) beam causing the charged, softened surface to distort under the forces of the data-bearing charge. An additional heat conductive layer, which is non-responsive to the heating (IR) beam, ensures fast heat transfer of the heat in the thermoplastic layer to a cooperating, coolant controlled heat sink, both of which combine to provide rapid cooling of the heat exposed portion. This ensures a short-duration, erase-write-read cycle.

9 Claims, 13 Drawing Figures

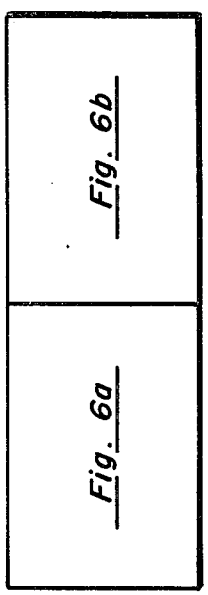
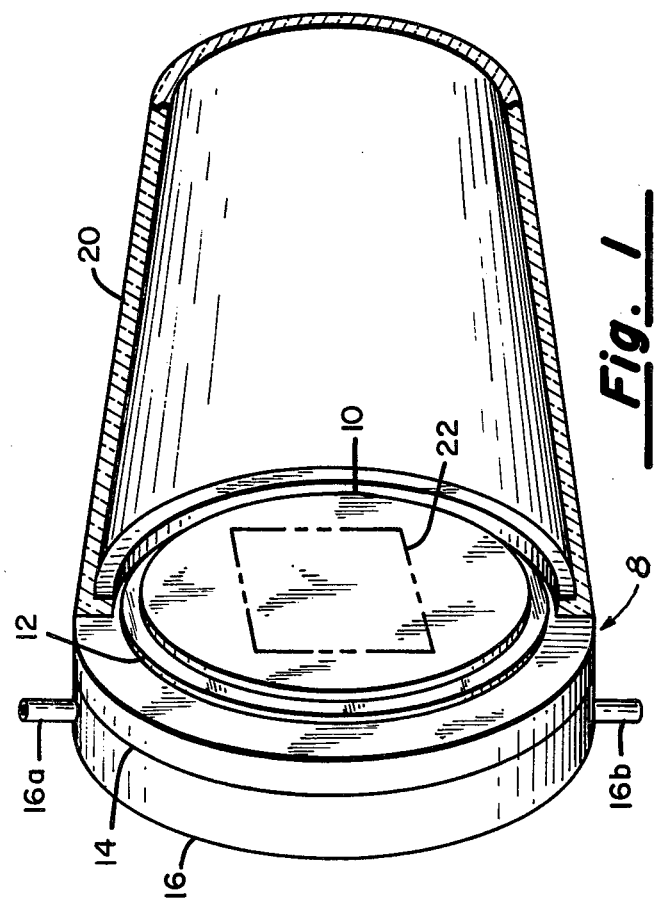
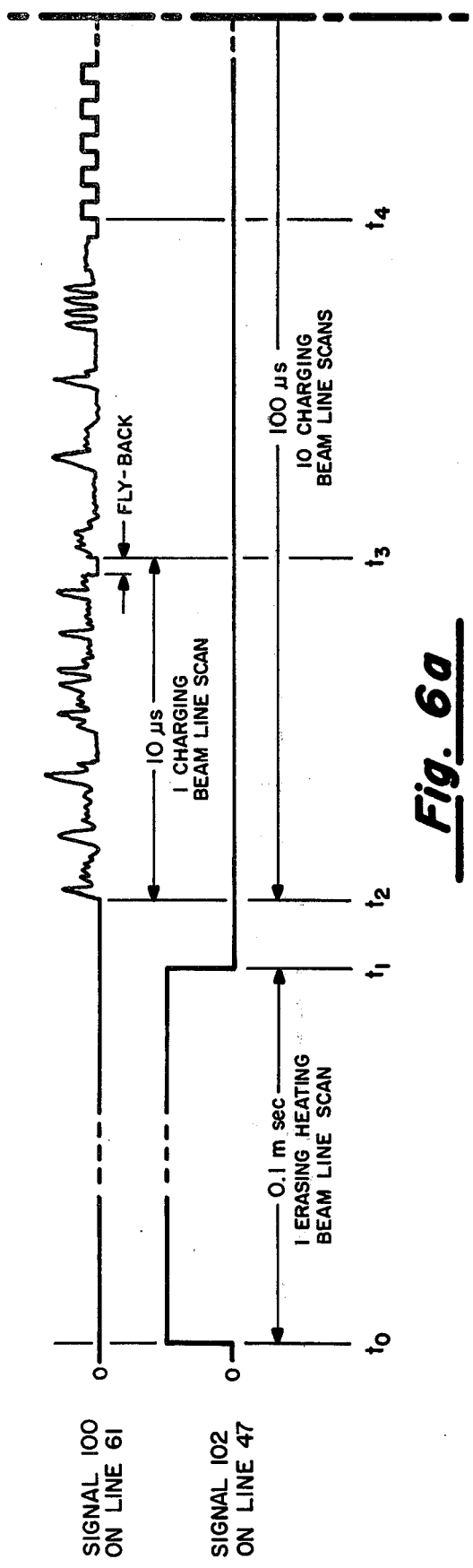

ERASE (T = $T_E$)

EXPOSE (T = $T_A$)

DEVELOP (T = $T_D$)

THERMOPLASTIC OPTICAL RECORDING SYSTEM

BACKGROUND OF THE INVENTION

In the prior art, it is known that optical information may be recorded or written in a thermoplastic layer by controlling the three parameters of surface charge density, light density and temperature of the thermoplastic layer — see the A. E. Jvirblis, et al., U.S. Pat. No. 3,795,514. More recently, work has indicated that holographic recording on thermoplastic layers or films may be the basis of future high-density holographic storage of analog and digital data. See the publications "Holographic Recording on Thermoplastic Films," T. C. Lee, Applied Optics, Volume 13, No. 4, April, 1974, Pages 888–895, and "An Experimental Read-Write Holographic Memory," W. C. Stewart, et al., RCA Review, Volume 34, March, 1973, Pages 3–44.

In the past, it was known to apply thermal energy to selective recording areas of a thermoplastic layer using a matrix array of resistive heating elements. This configuration requires at least two electrical connections per selected recording area. Accordingly, in an optical data storage system of reasonable size, the number of electrical connections would be near prohibitive with a significant portion of the area of the thermoplastic layer being required for such electrical connections. In the L. D'Auria U.S. Pat. No. 3,878,515 there is disclosed a thermoplastic storage system wherein each recording area of a thermoplastic layer along a given row is coupled to a pair of electrical busbars, each recording area including an electrical heating element and a photoconducting switching element. When the photoconducting switching element is exposed to a beam of light, the two associated busbars are intercoupled causing current to flow through the electrical heating element and, accordingly, to apply thermal energy to the associated recording area. However, this most recent system still requires that an inordinate portion or amount of the area of the thermoplastic layer be utilized by the busbars and related electrical apparatus including the thermal conducting switching element.

In the R. W. Honebrink, et al., U.S. Pat. No. 4,053,872 there is disclosed an apparatus for and a method of recording or writing optical data into a thermoplastic layer. The apparatus includes a layer of photoconductive material that is photoconductively responsive to a data-containing light beam having a wavelength below the IR range and a layer of thermoplastic material that is thermoplastically responsive to a light beam having a wavelength within the IR range. In practicing the method of that invention, the electrically charged apparatus is exposed to a data-bearing light beam having a wavelength below the IR range for selectively exposing, i.e., electrically charging, the photoconductive layer. Next, the apparatus is exposed to a light beam having a wavelength within the IR range for heating the thermoplastic film and thermally permitting the selective electric charge in the photoconductive layer to distort the surface of the thermoplastic layer and, accordingly, write into the thermoplastic layer the optical data that was contained within the data-bearing light beam.

In the publication "The EPIM TOPR In Optical Data Processing," G. D. Currie, et al., Proceedings of the Society of Photo-Optical Instrumentation Engineers, Volume 83, Aug. 24–25, 1976, Pages 8–12, there is disclosed an apparatus for and a method of optically recording or writing data into a thermoplastic layer that is formed as an integral part of the face of a CRT. In this system, the vacuum side of the CRT face is coated with a transparent conductor that serves as the anode for the electron beam and that provides resistive heating to the thermoplastic layer. Next, upon the transparent conductor there is coated a thermoplastic layer of a few microns ($\mu$m) in thickness. In the method of this system, the entire active area of the thermoplastic layer is scanned by an intensity-modulated, data-bearing electron beam after which the entire active area is resistively heated by the transparent conductor to the deformable state. Thus, both the charging and the heating steps are performed over the entire active area of the thermoplastic layer. This simultaneous heating of the entire active area of the thermoplastic layer requires the application of an inordinate amount of instantaneous heating energy followed by a relatively long period of dissipation (cooling) of the heating energy prior to a read operation and a subsequent erase-write-read operation. The present invention is directed toward an improvement to this system.

SUMMARY OF THE INVENTION

In the present invention, the prior art erase-write-read cycle time is substantially reduced by utilizing a more intense, shorter duration, smaller spot size heating beam to selectively heat the thermoplastic storage medium in a raster scan mode while concurrently utilizing the thermoplastic storage medium as one surface of a liquid cooled heat sink. The thermoplastic storage medium includes a heat conductive, but not IR energy absorbing, layer that does not conduct the radiated IR energy into adjacent, non IR radiated areas of the thermoplastic layer, but does conduct the IR energy generated heat away from the IR radiated area to the liquid cooled face of the heat sink. Additionally, consecutive heating beam, charging beam line scans permit the use of more intense, shorter duration heating of the thermoplastic layer. This is because the liquid cooled heat sink provides shorter duration heating, cooling cycles as the charging, heating, cooling operations are performed in rapid sequence.

BRIEF DESCRIPTION OF THE DRAWINGS

FIG. 1 is a diagrammatic illustration of the vacuum side of the face of a CRT showing the active elements of the thermoplastic storage medium of the present invention.

FIG. 6, 6A and 6B are illustrations of typical timing diagrams that may be utilized by the system of FIG. 5.

DESCRIPTION OF THE PREFERRED EMBODIMENTS

Figure 4:
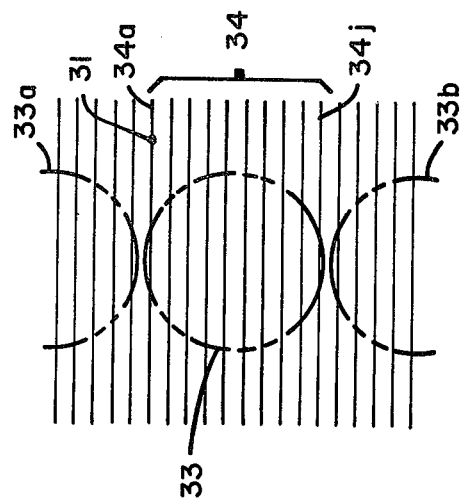
FIG. 4 is a diagrammatic illustration of an enlarged portion of the active area of FIG. 3.

With particular reference to FIG. 1 there is presented a diagrammatic illustration of the face of a CRT 20 showing the active elements of the thermoplastic storage medium of the present invention. As viewed from the vacuum side of CRT 20, the holographic storage medium 8 is comprised of the following integrally formed layers:

Thermoplastic layer 10 that is formed of a thermoplastic material that is thermally responsive to a heating beam, e.g., a $CO_2$ laser of 10.6 microns ($\mu$m) (wavelength), that is of a wavelength that is in the IR range, e.g., Staybeline Ester 10, Hercules Powder Company, of 1.0 $\mu$m in thickness;

Electrically conductive layer 12 that is formed of an electrically conductive material, e.g., indium oxide (InO) of 750 angstroms (Å) in thickness, that is optically transparent throughout the visible spectrum and that functions as the anode grounded externally — for the electron charging beam; and Heat conductive layer 14 that is formed of a heat conductive material that is thermally capable of absorbing very little IR energy during heating (absorptivity 0.005 $cm^{-1}$ at 10.6 $\mu$m) of thermoplastic layer 10, e.g., a zinc selenide (ZnSe) layer of 0.375 inch (in) in thickness, by the IR heating beam of, e.g., a $CO_2$ laser of 10.6 um (wavelength). See the publication "Optical Suitability of Window Materials for $CO_2$ Lasers," B. S. Patel, Applied Optics, Volume 16, No. 5, May, 1977, Pages 1232–1235.

Separate from, but sandwiching the peripheral edge of heat conductive layer 14 between the circumferential edge or peripheral flange 21 of CRT 20, is heat sink 16, which with the outside surface 15 of heat conductive layer 14 forms an enclosed space or coolant cell. Heat sink 16 is formed of a glass that is transparent to an HeNe reading beam but that is opaque to an IR heating beam. The coolant composition is selected to have a boiling temperature that is appropriate for the desired softening or developing temperature of thermoplastic layer 10. Illustrated on the vacuum side of thermoplastic layer 10 is an active storage area 22 which, e.g., in a 5 in. diameter CRT would be a 2" × 2" square area in which the data that is contained in the charging light beam is holographically recorded.

Figure 2:
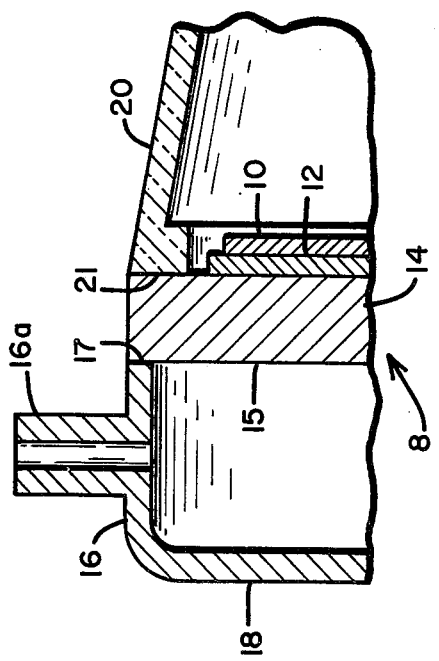
FIG. 2 is an enlarged cross-sectional view of the area of the CRT at which the heat sink and the thermoplastic storage medium join.

With particular reference to FIG. 2, there is presented an enlarged cross-sectional view of the edge of face 18 of CRT 20 that is formed by heat sink 16 and the storage medium 8, which is comprised of heat conductive layer 14, electrically conductive layer 12 and thermoplastic layer 10. Storage medium 8 is sandwiched at its peripheral edge between the enlarged edge or rim 21 of CRT 20 and the edge 17 of heat sink 16, the assemblage formed by any of various means such as clamps or the like. It is preferred that the arrangement be such that storage medium 8 be relatively easily removed from CRT 20 for its expeditious removal and replacement.

Figure 3:
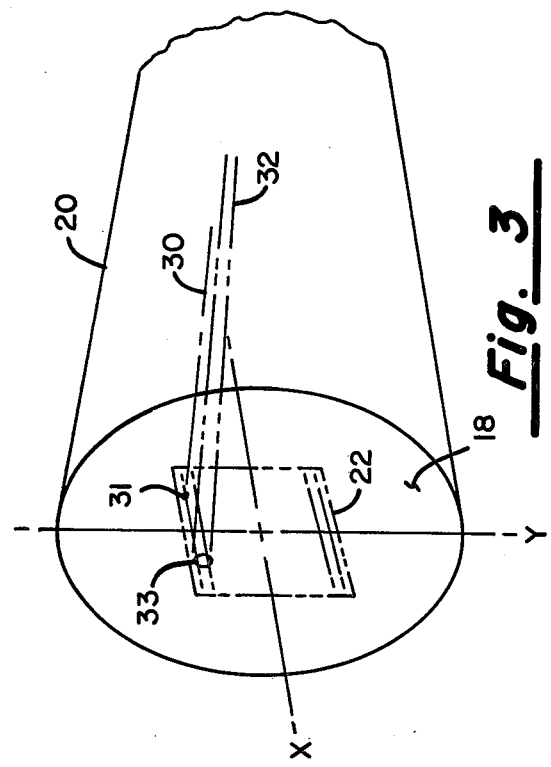
FIG. 3 is a diagrammatic illustration of the CRT of FIG. 1 showing the relationship of the electron charging beam, IR heating beam raster scan patterns in the active area of the thermoplastic layer.

With particular reference to FIG. 3 there is presented a diagrammatic illustration of CRT 20 of FIG. 1 for the purpose of showing the relationships of the (electron) charging beam, (IR) heating beam, raster scan patterns and the active area 22 of thermoplastic layer 10 of FIG. 1. In the present invention, thermoplastic layer 10 is initially scanned by an intensity modulated electron or charging beam 30 over the portion of active area 22 into which the data is to be written. As is known, this intensity modulated charging beam 30 charges the surface of thermoplastic layer 10 with a spatially varying charge of electrons, the manner of the spatial variation — along a raster scan line — being a function of the data that is to be recorded. Next, the portion of active area 22 into which the data was written is scanned by a heating beam 32, which heat energy along with the influence of the spatially varying electron charge deforms the surface of thermoplastic layer 10 in a manner that is representative of the data that is to be optically stored therein.

Upon cooling of the so-deformed thermoplastic layer 10, the data that was contained in the scanned charging beam is stored or fixed as surface deformations in thermoplastic layer 10. The stored information may then be read out of the storage medium by a suitable read beam, such as a low power laser beam that illuminates the entire surface of active area 22, which read beam is optically phase modulated by the surface deformations of thermoplastic layer 10 to generate a readout beam. The readout beam can then be further processed by various schemes as shown in publication "Spatial Light Modulator," D. Casasent, Proceedings of the IEEE, Volume 65, No. 1, January, 1977, Pages 143–162.

In the present invention, as in all optical data processing systems, primary goals are twofold: fast erase-write-read cycle times; and, high bit densities. In the present invention, fast erase-write-read cycle times have been achieved by the construction of the storage medium and the method of operation of the charging beam and the heating beam. This construction includes the combination of the ZnSe heat conductive layer 14, which provides rapid thermal conductivity of the heat energy that is provided by heating beam 32 in the area of the to-be-recorded data, and the heat sink 16, which provides a rapid cooling of the recorded-data-deformed thermoplastic layer 10, and thus provides substantially reduced erase-write-read cycle times. This is because the heating beam may couple a more intense, i.e., higher temperature generating but shorter duration, heat energy pulse to each recording area permitting a substantially shortened developing time — this more intense, shortened duration heat energy pulse being restricted in its heating effect (to the narrow area defined by the area in which the data is to be recorded) by the heat sink 16 and is not permitted to be coupled into adjacent areas in which already recorded data is stored.

In the embodiment of FIG. 3, it is shown that charging beam 30 may be focused to a charging spot 31 of 50.0 $\mu$m diameter (D) while heating beam 32, which cannot be effectively focused to the same spot size, is focused to a heating spot 33 of 0.50 millimeters (mm) D. Thus, in this embodiment, data is written in a block of data or in a data block that is comprised of ten vertically, adjacently oriented charging beam scan lines, which are encompassed by one heating beam scan line. This use of heating spot 33, which spans ten adjacently vertically and horizontally charging spots 31, optimizes the charging beam, heating beam scanning rates while providing a minimum erase-write-read cycle time and a maximum data density.

With respect to FIG. 4, there is illustrated, in more detail, this feature of the present invention. FIG. 4 illustrates that each vertically, parallelly aligned adjacent heating beam scan line — represented by heating spots 33a, 33, 33b — spans ten vertically, parallelly aligned adjacent charging beam scan lines. That is, heating spot 33 spans ten charging beam scan lines 34 — lines 34a through 34j.

Figure 5:
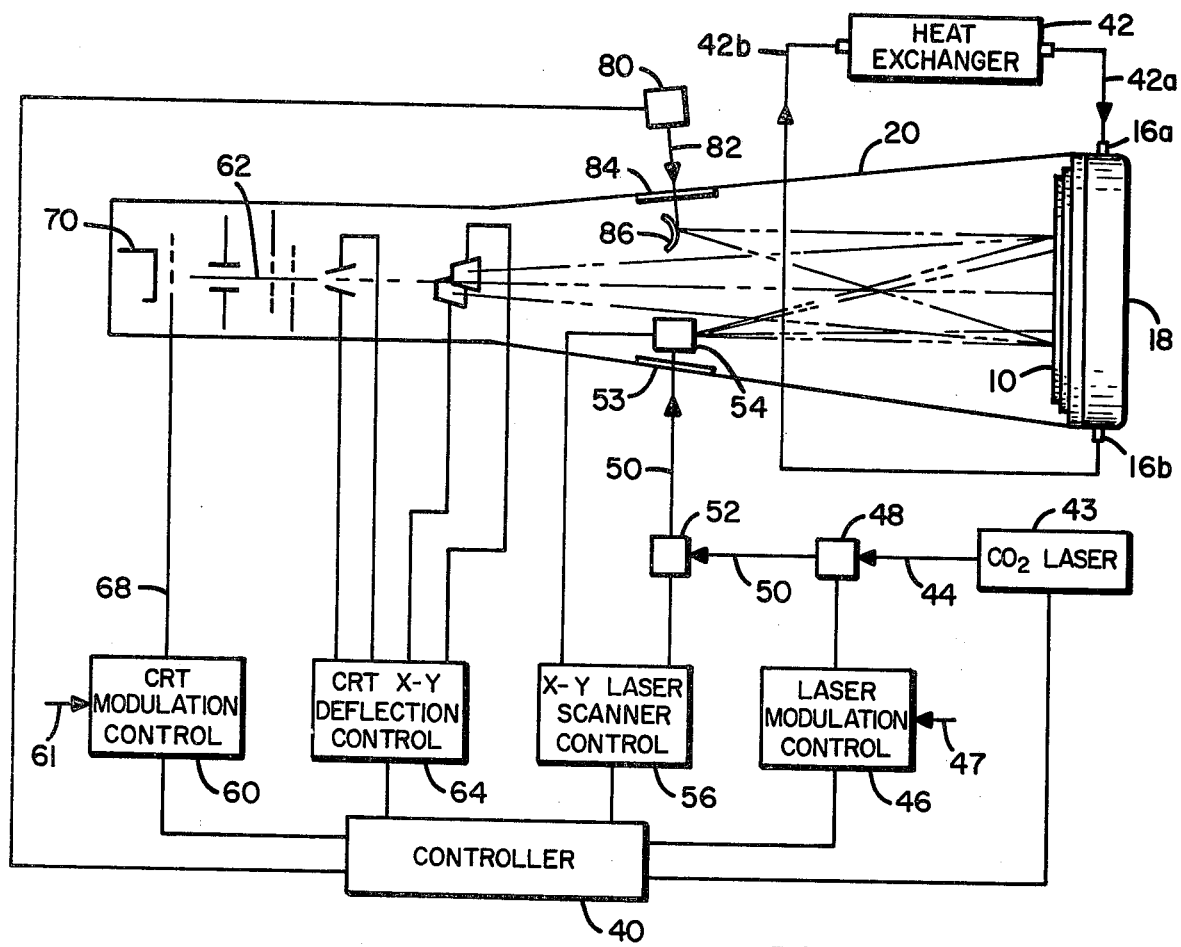
FIG. 5 is a diagrammatic illustration of an optical recording system incorporating the present invention.

With particular reference to FIG. 5, there is presented a diagrammatic illustration of an optical recording system incorporating the present invention. In the system of FIG. 5, there is illustrated a controller 40 that provides the timing and control for the electrical components of the system. Additionally, there is illustrated a heat exchanger 42 that, by means of input port 16a and output port 16b of heat sink 16, provides the means whereby heat sink 16, via the control of the coolant coupled thereto by coolant lines 42a and 42b, is maintained at the desired operating temperature. For a typical satisfactory coolant see Technical Bulletin "Fluorinert Brand Electronic Liquids," 3M Company, 1976 Edition, 3M Center, Saint Paul, Minnesota, 55101.

In a normal erase-write-read cycle, controller 40 enables $CO_2$ laser source 43 to emit an unmodulated heating beam 44. For a typical satisfactory $CO_2$ laser source see Technical Bulletin "Flowing $CO_2$ Lasers, Model XF Series," Apollo Lasers, Inc., 6357 Arizona Circle, Los Angeles, California 90045. Unmodulated heating beam 44 is, via laser modulator control 46 and laser modulator 48, modulated, via an appropriate heating control signal coupled to line 47, to provide a heating beam 50 that is of the proper intensity and duration, all as a function of the scan sweep rate, to couple to thermoplastic layer 10 the desired erasing thermal energy when swept across the portion of active area 22 into which the data is to be recorded or written. Laser modulator 48 may be of many well-known designs, e.g., Series EOM3 general purpose $CO_2$ Laser Modulator, II-VI, Incorporated, 207 Garden Lane, Glennshaw, Pennsylvania, 15116.

The erasing modulated heating beam 50 is then, via window 53 and Y axis deflector 52 and X axis deflector 54, both under control of X-Y laser scanner control 56, caused to be swept in a raster scan mode across the portion of active area 22 of thermoplastic layer 10 from which the already recorded data is to be erased and in which the new data is to be recorded or written. Note that as discussed hereinabove, in the presently discussed embodiment the erasing modulated heating beam 50 forms, on the surface of thermoplastic layer 10, a heating spot 33 that is of a diameter that spans ten vertically, parallelly, adjacently aligned charging beam scan lines — see FIG. 3. Deflectors 52 and 54 may be of many well-known designs, e.g.: deflector 52 — galvanometer deflector type, see the publication "Light Beam Deflector Performance; a Comparative Analysis," J. D. Zook, Applied Optics, Volume 13, No. 4, April, 1947, Pages 875–887; stripe domain deflector type — see the E. J. Torok U.S. Pat. No. 3,861,784; deflector 54 — galvanometer and stripe domain deflector types as in deflector 52 or a spinning mirror type — see Technical Bulletin 101-1, -2, -3, -4, -5, -6, 102-1, -2, -3, Speedring Division of the Schiller Corporation, 7111 East 11 Mile Road, Warren, Michigan, 48090.

After the erasing operation, controller 40 enables CRT modulation control 60 to generate a modulated electron or charging beam 62 which, under control of CRT X-Y deflection control 64, is caused to sweep in a raster scan mode across the portion of active area 22 of thermoplastic layer 10 into which the data is to be written. Control 60 may, via the appropriate input data signal coupled to line 61, provide via line 68, a corresponding analog or digital modulation of the electron beam from electron source 70.

After the charging operation, controller 40 enables $CO_2$ laser source 43 to emit the unmodulated heating beam 44. Unmodulated heating beam 44 is, via laser modulator control 46 and laser modulator 48, modulated, via an appropriate heating control signal coupled to line 47, to provide a heating beam 50 that is of the proper intensity and duration, all as a function of the scan sweep rate, to couple to thermoplastic layer 10 the desired developing thermal energy when swept across the portion of active area 22 into which the data is to be written.

After completion of the developing operation, the data that has been written into thermoplastic layer 10 may now be read out. For the readout operation, controller 40 enables HeNe laser source 80, which is a source of a reading beam 82 of 0.6328 $\mu$m, to, via window 84, impinge upon curved mirror 86. Curved mirror 86 is of the proper curvature to expand reading beam 82 into a sufficient cross-sectional area at thermoplastic layer 10 to illuminate the entire active area 22 by a spatially uniformly intense light beam that is of sufficient intensity across active area 22 to generate a phase modulated readout light signal for further data processing as described in the D. Casasent, et al., publication.

Figure 6B:
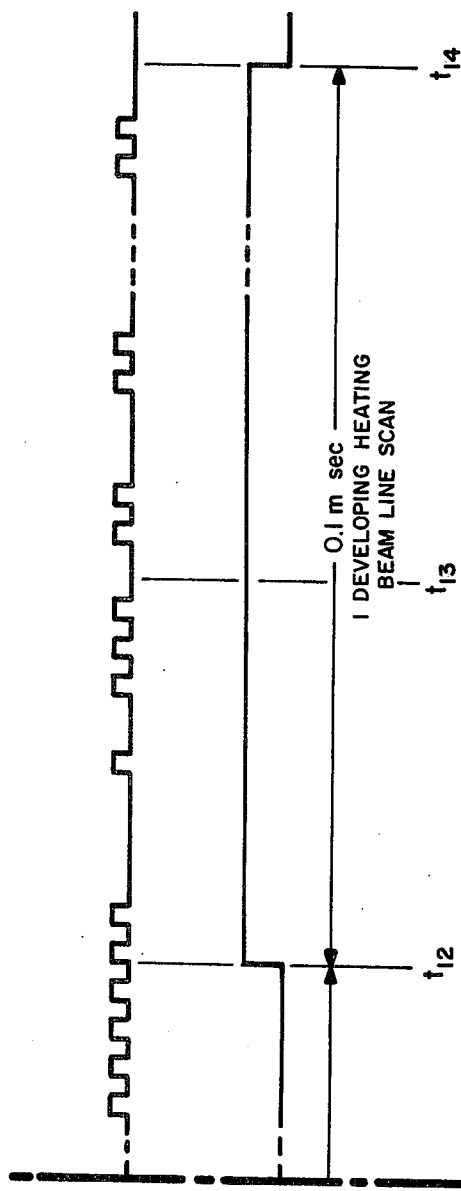

With particular reference to FIG. 6, there is presented a timing diagram of the erase-expose-develop (write) operation that may be employed in the utilization of thermoplastic layer 10 of FIG. 1 when incorporated in the system of FIG. 5. Additionally, with particular reference to FIGS. 7a, 7b, 7c, there are presented the diagrammatic illustrations of the effects of the erase-expose-develop operations of FIG. 6 upon storage medium 8 of FIG. 1. Using FIG. 6 as an illustration of a typical timing diagram of the erase-expose-develop cycle employed by the present invention, controller 40 — see FIG. 5 — initiates the sequence by coupling to $CO_2$ laser source 43 an appropriate signal that provides an erasing heating beam, as at time $t_O$, at the position of active area 22 into which the new data is to be recorded or written.

For purposes of the present invention, FIG. 6 indicates that a single line scan of the erasing heating beam is employed after which the charging beam is initiated. However, it is to be understood that a consecutive series of, e.g., 100 erasing heating beam line scans may be employed, thus erasing all the information stored in active area 22 of thermoplastic layer 10.

After completion of the erasing heating beam line scan of 0.1 millisecond (ms), as at time $t_1$, and after an appropriate cooling period of time $t_1$-$t_2$, e.g., 10 ms, controller 40, via the appropriate control signals to CRT modulation control 60, CRT X-Y deflection control 64 and the charging beam control signal 100 coupled to line 61, initiates the expose operation at time $t_2$. The expose operation consists of a series of charging beam line scans, each charging beam line scan passing in the X or horizontal direction — see FIG. 3 — over the two-inch width of active area 22, which charging beam line scan is of a 10 microsecond ($\mu$s) duration including fly-back time.

Signal 100 is, in FIG. 6, illustrated as an analog signal over the first two charging beam line scans, as from times $t_2$-$t_3$-$t_4$, but as a binary signal over the next subsequent eight charging beam line scans 3 through 10, as between time $t_4$ and $t_{14}$ and subsequent. However, it is to be appreciated that control signal 100 may be exclusively an analog signal or a digital signal as the needs require. As indicated in FIG. 6, controller 40 causes the charging beam to perform ten continuous line scans, as between time $t_2$ through time $t_{12}$ at which time, i.e., time $t_{12}$, controller 40 couples the appropriate control signal to $CO_2$ laser source 43 whereby a developing heating beam of, e.g., 0.1 ms duration is caused to scan the previously written ten charging beam line scans.

Concurrently with the application of the developing heating beam upon the charging beam scan lines 1 through 10 of active area 22 into which the data, represented by control signal 100 during the time $t_2$ through $t_{12}$, has been continuously coupled to line 61 of CRT modulation control 60, controller 40 has caused the corresponding subsequent data to be written into the corresponding subsequent charging beam scan lines 11 and subsequent, as at time $t_{12}$ and subsequent. Thus, the exposing and developing operations overlap or are interlaced whereby the prior in time ten vertically adjacent charging beam scan lines that were immediately previously exposed by control signal 100 are developed by the developing heating beam coupled thereto while, concurrently, the next vertically, parallelly adjacent group of ten charging beam scan lines are being exposed by the scanning charging beam under control of control signal 100, as between times $t_{12}$ through $t_{14}$.

Figure 7A:
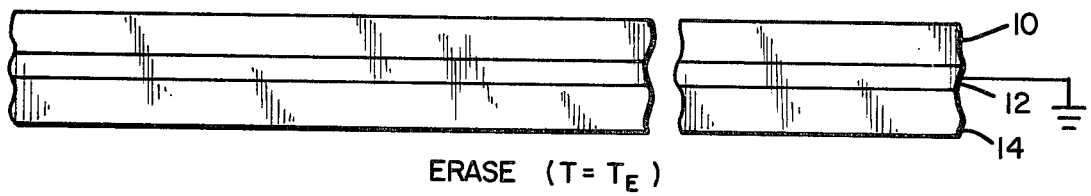
FIGS. 7a, 7b, 7c are diagrammatic illustrations of the effect of the expose-develop operations (of the write cycle or operation) of FIG. 5 upon the thermoplastic layer of FIG. 1.
Figure 7B:
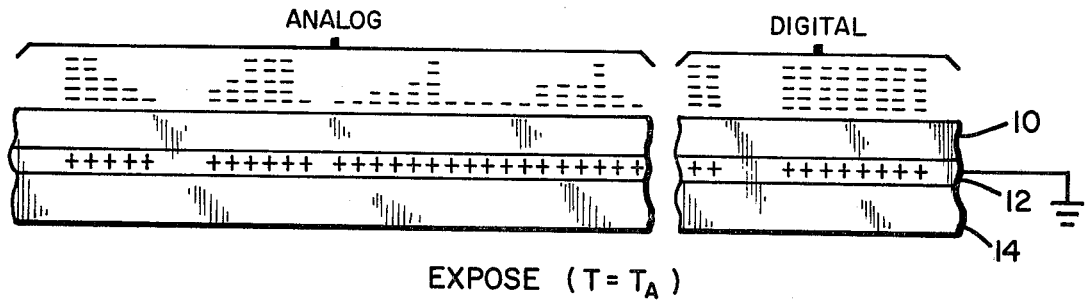
Figure 7C:
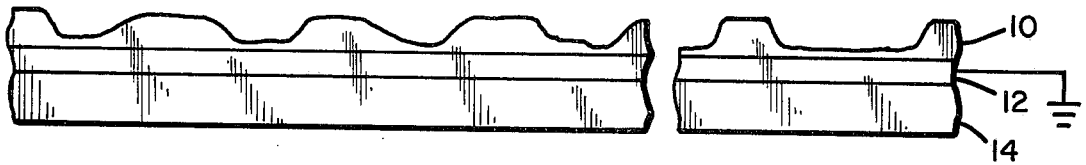

With reference now to FIGS. 7a, 7b, 7c, there is presented in FIG. 7a a diagrammatic illustration of storage medium 8 of FIG. 1 after completion of the erase operation whereby the temperature T of the thermoplastic layer 10 is that of the erasing temperature $T_E$, which erasing temperature $T_E$ is of sufficient thermal energy to cause all surface deformations, as in FIG. 7c, to be erased presenting a substantially smooth surface of thermoplastic layer 10 to the next exposing or charging operation.

In FIG. 7b there is presented a diagrammatic illustration of storage medium 8 of FIG. 1 after completion of the expose operation during which the temperature T of the thermoplastic layer 10 has been established at the ambient temperature $T_A$. FIG. 7b illustrates, by the representation of the height of the minus signs — representing number of electron charges — the corresponding amplitude or intensity of the control signal 100 as the charging beam sweeps across the exposed surface of thermoplastic layer 10.

With respect to FIG. 7c there is presented a diagrammatic illustration of storage medium 8 of FIG. 1 after completion of the develop cycle during which thermoplastic layer 10, while subjected to the electron charges diagrammatically illustrated in FIG. 7b was subjected to a developing temperature $T_D$ which was of sufficient thermal energy to permit the electron charges, illustrated in FIG. 7b, to produce the corresponding distorting effects upon the exposed surface of thermoplastic layer 10, illustrated in FIG. 7c. In this embodiment it is to be appreciated that the developing temperature $T_D$ is higher than the ambient temperature $T_A$ but less than the erasing temperature $T_E$, $T_A < T_D < T_E$, the respective temperatures being determined by the particular design and characteristics of the system of FIG. 5 into which storage medium 8 of FIG. 1 is incorporated.

In the illustrated embodiment of FIGS. 1, 2, 3, active area 22 is assumed to be a square area of 2" × 2" within a 5" diameter CRT. Using a charging spot 31 — see FIG. 3 — of 50.0 μm D and a heating spot 33 of 0.5 mm D, there is permitted a raster of 1000 charging beam scan lines. Using a charging beam line scan time of 10 μs to sweep the 2" long scan line — and ignoring a negligible fly-back time — the entire active area may be exposed in 10 μs × 1000 scan lines = 10 ms, if the erasing and developing operations would be performed before and after, respectively, the entire active area 22 is to be exposed by the charging beam. Alternatively, assuming an initial erasing of all of active area 22, the expose-develop operations would require 10 × 1 μs (to scan the initial ten charging beam scan lines by the charging beam) + 100 × 0.1 ms (to scan the 100 heating beam scan lines that encompass the 1000 charging beam scan lines).

Figure 8:
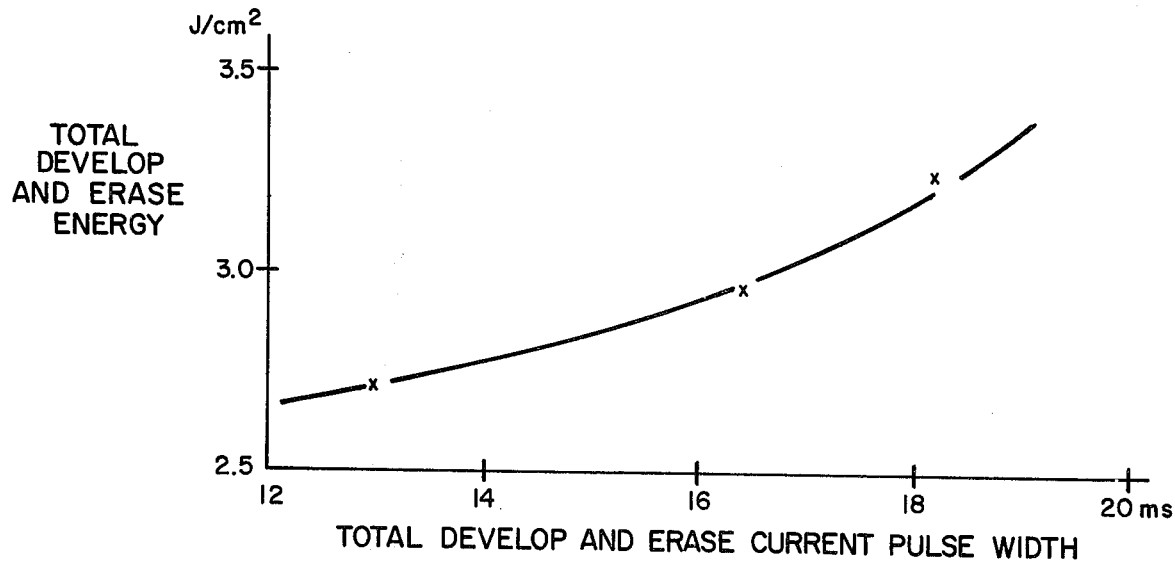
FIG. 8 is a graph of experimental data illustrating the relationship of heating energy imparted to the thermoplastic layer vs. heating energy IR beam pulse width.

With particular reference to FIG. 8, there is presented a graph of experimental data illustrating the relationship of heating energy imparted to thermoplastic layer 10 vs. heating (energy) beam pulse width. In order to reduce erase-write-read cycle times, it is essential that the thermal energy that is conveyed to thermoplastic layer 10 for the erase and develop operations be applied over as short a duration as possible while yet softening thermoplastic layer 10 to the extent desired. Prior art experiments have indicated that develop and erase times are approximately 0.5 s for an operative (spot) size of 50 mm × 50 mm — see the publication of G. D. Currie, et al., referenced hereinabove. Experimental data illustrated in FIG. 8 indicates that heating energy decreases from 3.25 Joules (J)/square centimeter ($CM^2$) to 2.7 $J/CM^2$ when heating energy pulse width decreases from 18.2 ms to 13.0 ms. This heating energy reduction is accomplished in the present invention by the use of the IR heating beam to heat a very small area of thermoplastic layer 10. It has been shown that a further reduction in the heating energy to less than 0.6 Joules/$CM^2$ is obtainable — see the publication "Submillisecond Development of Thermoplastic Recordings," W. T. Maloney, et al., Applied Optics, Volume 13, November, 1974, Page 1471.

Figure 9:
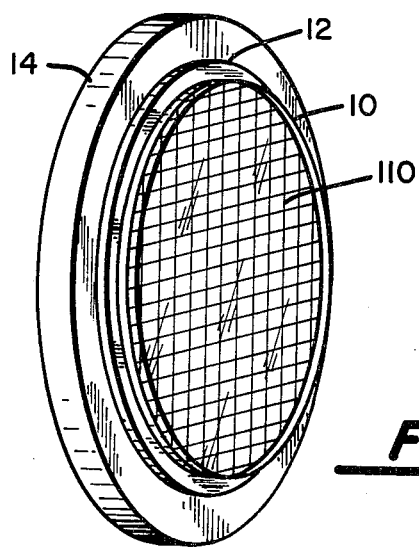
FIG. 9 is a diagrammatic illustration of a second embodiment of the storage medium of FIG. 1.

With particular reference to FIG. 9 there is presented a diagrammatic illustration of a second embodiment of the thermoplastic storage medium of FIG. 1. In this embodiment, all the layered elements thereof are identical to those of the embodiment of FIG. 1; however, in this second embodiment there is added a metallic grid 110 that is sandwiched between thermoplastic layer 10 and InO electrically conductive layer 12. Metallic grid 110 is preferably formed of a matrix array of gold (Au) strips 500 Å thick × 1 μm wide on 15 μm spacings. Metallic grid 110 may be utilized to further reduce IR absorption in the ZnSe heat conducting layer 14 and to enhance heat conductivity. Since metal, i.e., the gold strips, is opaque in the visible spectrum of the readout beam that is provided by HeNe laser source 80, the grid image must be filtered out during signal processing of the output signal.

In accordance with the above drawings and specification, it can be seen that the hereindescribed invention provides an improved optical data processing system providing faster erase-write-read cycle times and higher bit densities than those known in the prior art.

What is claimed is:

1. A device for the optical recording of data in a thermoplastic layer that is enclosed within a cathode ray tube, comprising:

an open cathode ray tube having a facial opening rimmed by a peripheral edge;
a recording medium, comprising:
- a heat conductive, substantially non IR energy absorbing, layer substantially spanning the peripheral edge of said cathode ray tube;
- an electrically conductive layer affixed to the surface of said heat conductive layer; and,
- a thermoplastic layer affixed to the surface of said electrically conductive layer;

a face member having a peripheral flange sandwiching the peripheral edge of said recording medium between the peripheral edge of said CRT for forming a liquid cooled heat sink with said recording medium and an evacuable enclosure with said cathode ray tube.

2. A method of forming an evacuable cathode ray tube for the optical recording of data in a liquid cooled thermoplastic layer, comprising:
- orienting the peripheral edge of a first surface of a storage medium including a thermoplastic layer across the facial opening of an open cathode ray tube;
- orienting a face member upon the peripheral edge of the second surface of said storage medium for forming a liquid cooled heat sink with said second surface of said storage medium; and
- forming an evacuable enclosure with said open cathode ray tube and the first surface of said storage medium by sandwiching said storage medium between the facial opening of said open cathode ray tube and said face member.

3. A method of forming an optical data recording device, comprising:
- orienting a storage medium including a thermoplastic layer across the face of a cathode ray tube;
- orienting a face member across the face of said cathode ray tube;
- sandwiching said storage medium between said cathode ray tube and said face member for forming a liquid cooled heat sink with said storage medium.

4. A method of recording data in a thermoplastic layer, comprising:
- defining the entire active area of a thermoplastic layer by a plurality of parallel heating IR beam scan lines;
- scanning only a selected one of said heating IR beam scan lines with a plurality of parallel charging electron beam scan lines;
- modulating said scanning charging electron beam by an information containing data signal;
- generating along each of said plurality of parallel charging electron beam scan lines, a spatially varying electron charge that is a function of said information containing data signal;
- scanning, with a heating IR beam that is of a wave length that is within the IR range, only the one selected one of said heating IR beam scan lines with a single heating IR beam line scan;
- simultaneously developing the data contained in said plurality of parallel charging electron beam scan lines within only the selected one of said heating IR beam scan lines as data representative surface deformations;
- cooling the selected one of said heating IR beam scan lines during the simultaneous development of the data contained in said plurality of parallel charging electron beam scan lines as data representative surface deformations.

5. A method of reading out the data recorded according to claim 4, comprising:
- illuminating said entire active area with a reading beam that is within the visible range;
- generating a readout beam by said reading beam passing through said entire active area.

6. A method of recording data in the active area of a thermoplastic layer, comprising:
- defining the entire active area of a thermoplastic layer by H horizontally parallelly aligned, vertically stacked heating IR beam scan lines;
- scanning each of h, where $1 \leq h \leq H$, of said IR beam scan lines by a plurality of horizontally parallelly aligned, vertically stacked charging electron beam scan lines;
- modulating said scanning charging electron beam by an information containing data signal;
- generating along each of said plurality of horizontally parallelly aligned, vertically stacked charging electron beam scan lines, a spatially varying electron charge that is a function of said information containing data signal;
- scanning, with a heating IR beam that is of a wave length that is within the IR range, each of said h IR beam scan lines with a single heating IR beam line scan;
- simultaneously developing the data contained in said plurality of horizontally parallelly aligned, vertically stacked charging electron beam scan lines as data representative surface deformations;
- cooling said entire active area by a liquid cooled heat sink before, during and after simultaneously developing the data contained in said plurality of horizontally parallelly aligned, vertically stacked charging electron beam scan lines as data representative surface deformations.

7. A method of reading out the data recorded according to claim 6, comprising:
- illuminating said entire active area with a reading beam that is within the visible range;
- generating a readout beam by said reading beam passing through said entire active area.

8. A device for the optical recording of data in a thermoplastic layer that is enclosed within a cathode ray tube, comprising:
- an open cathode ray tube having a facial opening rimmed by a peripheral edge;
- a recording medium including a thermoplastic layer that is oriented within the facial opening of said cathode ray tube; and,
- an optically transparent face member substantially spanning the facial opening of said cathode ray tube for forming a liquid cooled heat sink for said recording medium and an evacuable enclosure with said cathode ray tube.

9. A device for the optical recording of data in a thermoplastic layer that is enclosed within a cathode ray tube, comprising:
- an open cathode ray tube having a facial opening rimmed by a peripheral edge;
- an integrally layered recording medium, comprising:
  - a heat conductive, substantially non IR energy absorbing, layer substantially spanning the peripheral edge of said cathode ray tube;
  - an electrically conductive layer; and,
  - a thermoplastic layer;

an optically transparent face member having a peripheral flange that forms an enclosed space with a first surface of said recording medium for forming a liquid cooled heat sink with said recording medium; and, said face member sandwiching said recording medium between it and the peripheral edge of said cathode ray tube for forming an evacuable enclosure with said cathode ray tube and said recording medium.

* * * * *